(12) United States Patent
Kiyama (10) Patent No.: US 9,437,448 B2
(45) Date of Patent: Sep. 6, 2016

(54) SUBSTRATE TREATMENT METHOD AND SUBSTRATE TREATING APPARATUS

(71) Applicant: SCREEN Holdings Co., Ltd., Kyoto (JP)

(72) Inventor: Hiroki Kiyama, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 14/417,698

(22) PCT Filed: Jun. 7, 2013

(86) PCT No.: PCT/JP2013/065778
§ 371 (c)(1),
(2) Date: Jan. 27, 2015

(87) PCT Pub. No.: WO2014/034217
PCT Pub. Date: Mar. 6, 2014

(65) Prior Publication Data
US 2015/0200108 A1    Jul. 16, 2015

(30) Foreign Application Priority Data
Aug. 27, 2012 (JP) .................................. 2012-186127

(51) Int. Cl.
*H01L 21/311* (2006.01)
*H01L 21/02* (2006.01)
(Continued)

(52) U.S. Cl.
CPC ...... *H01L 21/31111* (2013.01); *H01L 21/0206* (2013.01); *H01L 21/02052* (2013.01);
(Continued)

(58) Field of Classification Search
CPC .................. H01L 21/31111; H01L 21/02052; H01L 21/0206; H01L 21/02282; H01L 21/2252; H01L 21/2254; H01L 21/67028; H01L 21/67074; H01L 21/67052; H01L 21/67075; H01L 21/67086
See application file for complete search history.

(56) References Cited

U.S. PATENT DOCUMENTS 3,607,469 A * 9/1971 Madden .................. H01L 21/00
257/394
2008/0242113 A1  10/2008 Aoyama et al.
(Continued)

FOREIGN PATENT DOCUMENTS

JP      2010-041000       2/2002
JP      2002-100574       4/2002
(Continued)

OTHER PUBLICATIONS

International Preliminary Report on Patentability (IPRP) issued by the IPEA/EP Patent.
(Continued)

*Primary Examiner* — Duy Deo
(74) *Attorney, Agent, or Firm* — Ostrolenk Faber LLP (57) ABSTRACT

A hydrofluoric acid is supplied to a surface of a substrate, and a native oxide film formed on the surface is corroded to be removed, exposing silicon in the surface of the substrate. Then, a rinse solution such as alcohols is supplied to the surface of the substrate, and then, the hydrofluoric acid is washed off from the surface. After that, a dopant solution, which is a dopant-containing chemical solution, is supplied to the surface of the substrate. The dopant solution comes into contact with the surface of the substrate, which is not hydrogen-terminated and has silicon exposed, thereby forming a dopant-containing monolayer thin film on the surface in a short period of time.

7 Claims, 7 Drawing Sheets

(51) Int. Cl.
*H01L 21/67* (2006.01)
*H01L 21/225* (2006.01)

(52) U.S. Cl.
CPC ..... *H01L21/02282* (2013.01); *H01L 21/2252* (2013.01); *H01L 21/2254* (2013.01); *H01L 21/6704* (2013.01); *H01L 21/67028* (2013.01); *H01L 21/67051* (2013.01); *H01L 21/67075* (2013.01); *H01L 21/67086* (2013.01)

(56) References Cited

U.S. PATENT DOCUMENTS

| | | | |
|---|---|---|---|
| 2009/0087566 A1 | 4/2009 | Kimura | 427/299 |
| 2009/0158613 A1 | 6/2009 | Aihara | 34/341 |
| 2009/0242517 A1 | 10/2009 | Fujiwara et al. | 216/92 |
| 2011/0214727 A1* | 9/2011 | Esturo-Breton | H01L 31/022425 136/255 |
| 2012/0003826 A1 | 1/2012 | Pollard et al. | 438/542 |
| 2012/0085941 A1 | 4/2012 | Shibata | 250/492.21 |
| 2014/0109430 A1 | 4/2014 | Aihara | 34/201 |

FOREIGN PATENT DOCUMENTS

| | | |
|---|---|---|
| JP | 2010-041000 | 2/2010 |
| JP | 2010-082462 | 4/2012 |
| KR | 10-2003-0020059 | 3/2003 |
| KR | 10-2009-0033023 | 4/2009 |
| WO | WO 2007/043312 | 4/2007 |
| WO | WO 2007/043312 A1 | 4/2007 |
| WO | WO 2011/112546 A1 | 9/2011 |

OTHER PUBLICATIONS

Office on Mar. 12, 2015 in connection with corresponding application PCT/JP2013/065778.
International Search Report mailed Sep. 10, 2013 in corresponding PCT International Application No. PCT/JP2013/065778.
Johnny C. Ho et al., "Controlled nanoscale doping of semiconductors via molecular monolayers," Nature Materials, vol. 7, pp. 62-67, S1-S10, 2008.
Korean Office Action issued Nov. 5, 2015 in corresponding Korean Patent Application No. 10-2015-7005046, along with English translation of relevant portions thereof.
Japanese Office Action issued Jul. 12, 2016 in corresponding Japanese Patent Application.
No. 2012-186127, along with English translation of relevant portions thereof.
Korean Office Action issued May 31, 2016 in corresponding Korean Patent Application.
No. 10-2015-7005046, along with English translation of relevant portions thereof.

* cited by examiner

SUBSTRATE TREATMENT METHOD AND SUBSTRATE TREATING APPARATUS

CROSS-REFERENCE TO RELATED APPLICATIONS

The present application is a 35 U.S.C. §§371 national phase conversion of PCT/JP2013/065778, filed Jun. 7, 2013, which claims priority to Japanese Patent Application No. JP2012-186127, filed Aug. 27, 2012, the contents of which are incorporated herein by reference. The PCT International Application was published in the Japanese language.

TECHNICAL FIELD

The present invention relates to a substrate treatment method and a substrate treating apparatus for forming a thin film containing a dopant such as boron on a surface of a substrate such as a silicon semiconductor wafer.

BACKGROUND ART

In the process of manufacturing a semiconductor device, the introduction of impurities (dopant) is a step required for forming a p-n junction in a semiconductor wafer. Currently, impurities are generally introduced by ion implantation and subsequent annealing. Ion implantation is a technique of ionizing elements of impurities such as boron (B), arsenic (As), or phosphorous (P) to collide the ions with a silicon semiconductor substrate at high acceleration voltage, thereby physically implanting impurities (for example, see Patent Document 1). The implanted impurities are activated through annealing.

Traditionally performed ion implantation has an advantage of easily controlling the implantation depth and concentration of impurities in the introduction of impurities. The increasingly smaller sizes of semiconductor devices, however, require the introduction of impurities in only an extremely shallow region (with a depth not greater than several nm) of a surface layer of the substrate. Ion implantation has difficulty in accurately implanting impurities in only such an extremely shallow surface layer region. The 3D transistor technology, which has been under development, needs to introduce impurities into a concavo-convex three-dimensional pattern. It is therefore difficult to introduce impurities uniformly into the entire surface of the concavo-convex pattern by ion implantation of colliding ions from one direction.

Under the circumstances, the following technique has been researched, which forms a dopant-containing monolayer on the surface of a silicon substrate by a wet treatment and diffuses the dopant in a substrate surface layer by a subsequent heat treatment, thereby introducing impurities into only an extremely shallow region of the substrate surface layer (see Non-Patent Document 1). The dopant diffusion from a monolayer allows the introduction of impurities into only an extremely shallow region of a substrate surface layer. Additionally, forming a dopant-containing monolayer by a wet treatment allows impurities to be uniformly introduced into an entire surface having a complex concavo-convex pattern.

PRIOR ART DOCUMENTS

Patent Document

Patent Document 1: Japanese Patent Application Laid-Open No. 2012-82462 Non-Patent Document Non-Patent Document 1: JOHNNY C. HO, ROIE YERUSHALMI, ZACHERY A. JACOBSON, ZHI-YONG FAN, ROBERT L. ALLEY and ALI JAVEY, "Controlled nanoscale doping of semiconductors via molecular monolayers, nature materials," Nature Publishing Group, vol. 7, pp. 62-67, published online on Nov. 11, 2007

SUMMARY OF INVENTION

Problem to be Solved by the Invention

In the technique disclosed in Non-Patent Document 1, a native oxide film is removed with a hydrofluoric acid, and then, the hydrogen termination is performed to stabilize the surface state. Then, a dopant-containing chemical solution is supplied to the surface of the hydrogen-terminated silicon substrate to replace the hydrogen termination with a dopant, thereby forming a monolayer containing the dopant. After that, a capping film of silicon dioxide is formed and is subjected to a light-emission and heat treatment, thereby diffusing the dopant into the substrate surface.

Unfortunately, the technique disclosed in Non-Patent Document 1 takes an extremely long period of time (for example, according to Non-Patent Document 1, 2.5 hours) to form a monolayer. If the process of forming a monolayer takes such a long period of time, a practical throughput cannot be obtained.

The present invention has been made in view of the above-mentioned problem, and an object thereof is to provide a substrate treatment method and a substrate treating apparatus capable of forming a dopant-containing thin film in a short period of time.

Means for Solving the Problem

To solve the above-mentioned problem, a first aspect of the present invention relates to a substrate treatment method for forming a dopant-containing thin film on a surface of a substrate, and the method supplies, without hydrogen-termination to a surface of a substrate, from which an oxide film is removed, a dopant solution to the surface of the substrate to form a dopant-containing thin film.

In a second aspect, the substrate treatment method according to the first aspect includes: an oxide film removing step of supplying a hydrofluoric acid to a surface of a substrate to remove an oxide film formed on the surface; a rinse step of supplying a rinse solution to the surface to wash off the hydrofluoric acid after the oxide film removing step; and a thin film forming step of supplying a dopant solution to the surface to form a thin film after the rinse step.

In a third aspect, in the substrate treatment method according to the second aspect, the oxide film removing step, the rinse step, and the thin film forming step are performed continuously.

In a fourth aspect, in the substrate treatment method according to the second aspect, the oxide film removing step, the rinse step, and the thin film forming step are performed in a non-air atmosphere.

In a fifth aspect, the substrate treatment method according to the first aspect supplies a mixture of a hydrofluoric acid and a dopant solution to a surface of a substrate to form a dopant-containing thin film on the surface while removing an oxide film formed on the surface.

In a sixth aspect, the substrate treatment method according to the first aspect includes: an oxide film removing step of supplying a hydrofluoric acid to a surface of a substrate to remove an oxide film formed on the surface; and a thin film forming step of supplying a dopant solution to the surface to form a thin film. The thin film forming step is started from the middle of the oxide film removing step.

In a seventh aspect, in the substrate treatment method according to the first aspect, a thin film to be formed on the surface of the substrate with a dopant solution is a monolayer.

An eighth aspect relates to a substrate treating apparatus that forms a dopant-containing thin film on a surface of a substrate, the apparatus including: a chamber that houses a substrate; a holder for holding the substrate in the chamber; a hydrofluoric acid supply part for supplying a hydrofluoric acid to a surface of the substrate held by the holder to remove an oxide film formed on the surface; a rinse solution supply part for supplying a rinse solution to the surface of the substrate to wash off the hydrofluoric acid; a dopant solution supply part for supplying a dopant solution to the surface of the substrate to form a thin film; and a controller for controlling the hydrofluoric acid supply part, the rinse solution supply part, and the dopant solution supply part such that a hydrofluoric acid, a rinse solution, and a dopant solution are continuously supplied to the surface.

A ninth aspect relates to a substrate treating apparatus that forms a dopant-containing thin film on a surface of a substrate, the apparatus including: a chamber that houses a substrate; a holder for holding the substrate in the chamber; a hydrofluoric acid supply part for supplying a hydrofluoric acid to a surface of the substrate held by the holder to remove an oxide film formed on the surface; a dopant solution supply part for supplying a dopant solution to the surface of the substrate to form a thin film; and a controller for controlling the hydrofluoric acid supply part and the dopant solution supply part such that a supply of the dopant solution is started from the middle of a supply of the hydrofluoric acid to the surface.

A tenth aspect relates to a substrate treating apparatus that forms a dopant-containing thin film on a surface of a substrate, the apparatus including: a treatment vessel capable of storing a processing solution; a holder for holding a substrate in a location for immersing in which the substrate is immersed in the processing solution stored in the treatment vessel; a hydrofluoric acid supply part for supplying a hydrofluoric acid to the treatment vessel; a rinse solution supply part for supplying a rinse solution to the treatment vessel; a dopant solution supply part for supplying a dopant solution to the treatment vessel; and a controller for controlling the hydrofluoric acid supply part, the rinse solution supply part, and the dopant solution supply part such that in a state in which the substrate is held in the location for immersing, a hydrofluoric acid is supplied to the treatment vessel to store the hydrofluoric acid, a rinse solution is subsequently supplied to the treatment vessel to replace the hydrofluoric acid with the rinse solution, and subsequently, a dopant solution is supplied to the treatment vessel to replace the rinse solution with the dopant solution.

An eleventh aspect relates to a substrate treating apparatus that forms a dopant-containing thin film on a surface of a substrate, the apparatus including: a treatment vessel capable of storing a processing solution; a holder for holding a substrate in a location for immersing in which the substrate is immersed in the processing solution stored in the treatment vessel; a hydrofluoric acid supply part for supplying a hydrofluoric acid to the treatment vessel; a dopant solution supply part for supplying a dopant solution to the treatment vessel; and a controller for controlling the hydrofluoric acid supply part and the dopant solution supply part such that in a state in which the substrate is held in the location for immersing, a mixture of a hydrofluoric acid and a dopant solution is supplied to the treatment vessel to be stored.

In a twelfth aspect, in the substrate treating apparatus according to the eighth aspect, a thin film to be formed on the surface of the substrate with a dopant solution is a monolayer.

Effects of the Invention

According to the substrate treatment method for the first to seventh aspects, without hydrogen-termination to a surface of a substrate, from which an oxide film is removed, a dopant solution is supplied to the surface of the substrate to form a dopant-containing thin film. This allows the surface of the substrate to be immediately bonded to a dopant without an occurrence of the process of replacing the hydrogen termination with a dopant, forming a dopant-containing thin film in a short period of time.

According to the substrate treating apparatus of the eighth aspect, a hydrofluoric acid, a rinse solution, and a dopant solution are continuously supplied to the substrate surface. This allows the dopant solution to come into contact with the substrate surface that has not been hydrogen-terminated, forming a dopant-containing thin film in a short period of time.

According to the substrate treating apparatus of the ninth aspect, a supply of a dopant solution is started from the middle of a supply of a hydrofluoric acid to the substrate surface. This allows the dopant solution to come into contact with the substrate surface that has not been hydrogen-terminated, forming a dopant-containing thin film in a short period of time.

According to the substrate treating apparatus of the tenth aspect, in the state in which the substrate is held in the location for immersing, a hydrofluoric acid is supplied to the treatment vessel to store the hydrofluoric acid, a rinse solution is then supplied to the treatment vessel to replace the hydrofluoric acid with the rinse solution, and subsequently, a dopant solution is supplied to the treatment vessel to replace the rinse solution with the dopant solution. This allows the dopant solution to come into contact with the substrate surface that has not been hydrogen-terminated, forming a dopant-containing thin film in a short period of time.

According to the substrate treating apparatus of the eleventh aspect, in the state in which the substrate is held in the location for immersing, a mixture of a hydrofluoric acid and a dopant solution is supplied to the treatment vessel to be stored. This allows the dopant solution to come into contact with the substrate surface that has not been hydrogen-terminated, forming a dopant-containing thin film in a short period of time.

According to the substrate treating apparatus of the twelfth aspect, a dopant-containing monolayer thin film is formed in a short period of time.

DESCRIPTION OF EMBODIMENTS

Hereinafter, embodiments of the present invention will be described in detail with reference to the drawings.

1. First Embodiment

1-1. Overall Apparatus Configuration

Figure 1:
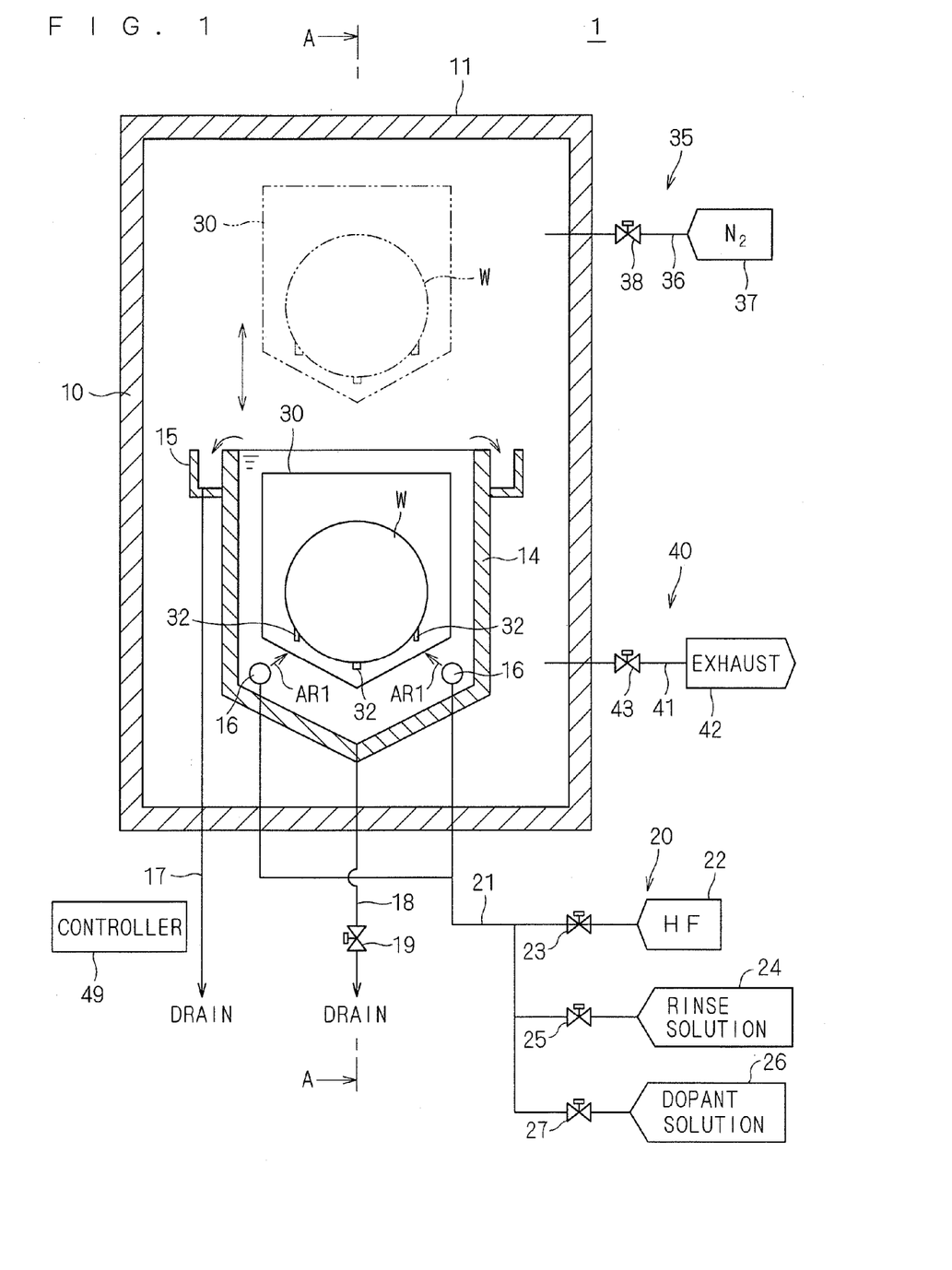
FIG. 1 is a vertical cross-sectional view of a substrate treating apparatus according to a first embodiment.
Figure 2:
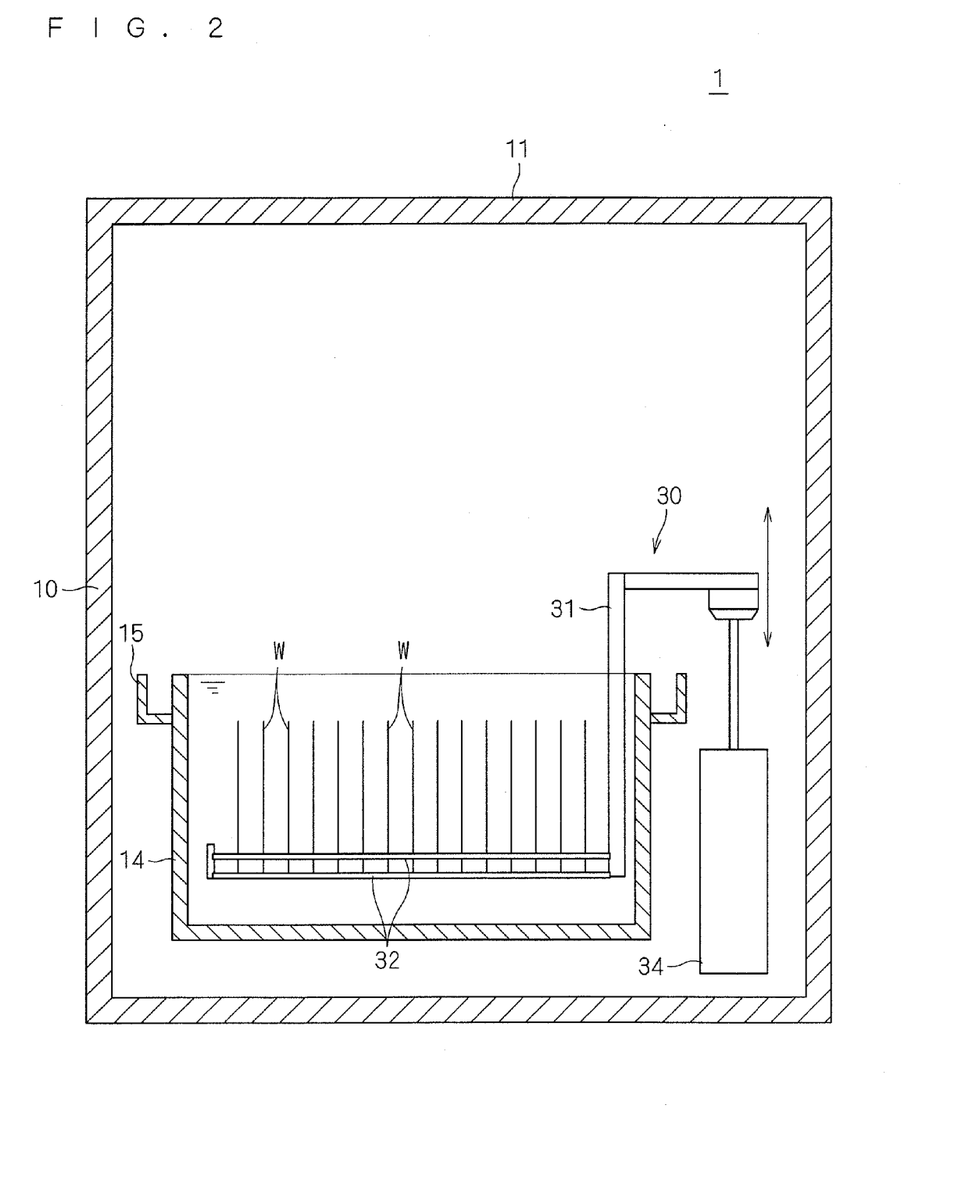
FIG. 2 is a vertical cross-sectional view of the substrate treating apparatus of FIG. 1, which is taken along a position A-A.

FIG. 1 is a vertical cross-sectional view of a substrate treating apparatus 1 according to a first embodiment, which is taken along a plane parallel to a substrate W. FIG. 2 is a vertical cross-sectional view of the substrate treating apparatus 1 of FIG. 1, which is taken along a position A-A. The substrate treating apparatus 1 according to the first embodiment is a batch apparatus that collectively treats the surfaces of a plurality of substrates W.

The substrate treating apparatus 1 performs a treatment of removing an oxide film with a hydrofluoric acid on a plurality of substrates W, and then, washes off the hydrofluoric acid from the surfaces of the substrates W with a rinse solution. Then, a monolayer thin film is formed on each of the surfaces of the substrates W with a dopant-containing chemical solution. The substrate treating apparatus 1 mainly includes a chamber 10, a treatment vessel 14, a processing solution supply mechanism 20, a lifter 30, a gas supply mechanism 35, an exhaust mechanism 40, and a controller 49.

The chamber 10 is a housing that houses the treatment vessel 14, the lifter 30, or the like therein. An upper portion 11 of the chamber 10 is openable/closable by a sliding open/close mechanism (not shown). With the upper portion 11 being opened, a plurality of substrates W can be transported into and out the chamber 10 through the opened portion. Meanwhile, with the upper portion 11 being closed, the interior of the chamber 10 is an enclosed space.

The treatment vessel 14 is a box-shaped container, rectangular in plan view, for storing processing solutions such as a hydrofluoric acid (HF). Provided near the inner bottom of the treatment vessel 14 are two rod-shaped ejection nozzles 16. The two ejection nozzles 16 are provided to be parallel to each other such that the longitudinal direction thereof extends in the longitudinal direction of the treatment vessel 14. Drilled in each ejection nozzle 16 are a plurality of ejection holes (not shown) at regular intervals in the longitudinal direction. The plurality of ejection holes are provided so as to face the side of the substrate W immersed in the treatment vessel 14. This configuration allows a processing solution to be ejected obliquely upward from the two ejection nozzles 16 toward the interior of the treatment vessel 14, as indicated by arrows AR1. In this specification, the "processing solution" generically refers to a hydrofluoric acid, a rinse solution, and a dopant solution described below.

The upper portion of the treatment vessel 14 is opened, and an outer vessel 15 is provided to the upper end of the outer wall surface of the treatment vessel 14 so as to surround the upper end. The processing solution ejected from the ejection nozzles 16 forms an upflow flowing upward in the interior of the treatment vessel 14 and overflows from the upper opening of the treatment vessel 14 to the outer vessel 15. The processing solution flowing into the outer vessel 15 is discharged out of the substrate treating apparatus 1 through a drain line 17. Similarly, a drain line 18 is connected in communication with the bottom of the treatment vessel 14, and a drain valve 19 is provided in the drain line 18. Opening the drain valve 19 allows the processing solution stored in the treatment vessel 14 to be drained rapidly.

The processing solution supply mechanism 20 is the mechanism that supplies various processing solutions to the interior of the treatment vessel 14. The distal-end side of the supply pipe 21 of the processing solution supply mechanism 20 is branched into two portions, each of which being connected to the ejection nozzle 16. The proximal-end side of the supply pipe 21 is branched into three portions, which are respectively connected to a hydrofluoric acid supply source 22, a rinse solution supply source 24, and a dopant solution supply source 26. Of the supply pipe 21 branched into three portions at the proximal-end side, a hydrofluoric acid valve 23 is provided in the tube connected to the hydrofluoric acid supply source 22, a rinse solution valve 25 is provided in the tube connected to the rinse solution supply source 24, and a dopant solution valve 27 is provided in the tube connected to the dopant solution supply source 26.

In the above-mentioned configuration, when the hydrofluoric acid valve 23 is opened, a hydrofluoric acid is delivered to the ejection nozzle 16 from the hydrofluoric acid supply source 22, and then, the hydrofluoric acid is supplied to the interior of the treatment vessel 14 from the ejection nozzle 16. The hydrofluoric acid, which is an aqueous solution of hydrogen fluoride, has the property of corroding silicon dioxide ($SiO_2$). The hydrofluoric acid supplied from the hydrofluoric acid supply source 22, shall have an appropriate concentration.

When the rinse solution valve 25 is opened, a rinse solution is delivered from the rinse solution supply source 24 to the ejection nozzle 16, and then, the rinse solution is supplied to the interior of the treatment vessel 14 from the ejection nozzle 16. Alcohols are used as the rinse solution, and an isopropyl alcohol (IPA) is used in the first embodiment. The alcohol to be used as the rinse solution is not limited to IPA, which may be, for example, an ethanol.

When the dopant solution valve 27 is opened, a dopant solution is delivered from the dopant solution supply source 26 to the ejection nozzle 16, and then, the dopant solution is supplied to the interior of the treatment vessel 14 from the ejection nozzle 16. Herein, the dopant solution, which is a dopant-containing chemical solution, has the property of forming a dopant-containing monolayer thin film on a surface of a silicon substrate W by coming into contact with the surface. The first embodiment uses, as a dopant solution, an allylboronic acid pinacol ester containing boron (B) as a dopant.

Any one of the hydrofluoric acid valve 23, the rinse solution valve 25, and the dopant solution valve 27 may be alternatively opened, or two or more of them may be simultaneously opened. For example, if the hydrofluoric acid valve 23 and the dopant solution valve 27 are simultaneously opened, a mixture of a hydrofluoric acid and a dopant solution is supplied to the interior of the treatment vessel 14.

The lifter 30, which is the mechanism that holds a plurality of substrates W to lift them up and down, includes a lifter head 31, three holding rods 32, and a lift driving part 34. The three holding rods 32 are each extended from the lifter head 31 such that the longitudinal direction thereof extends along the longitudinal direction of the treatment vessel 14 (that is, is parallel to the ejection nozzles 16). A plurality of holding grooves (not shown) are carved at predetermined intervals in the holding rods 32. A plurality of substrates W are collectively held in an upright position (a position in which the normal of the substrate W extends horizontally) in the plurality of holding grooves carved in the three holding rods 32. The lifter head 31 is connected to the lift driving part 34. Driving of the lift driving part 34 causes the plurality of substrates W held by the three holding rods 32 to be lifted up and down between a location for immersing (a location indicated by a solid line of FIG. 1) in which the substrates W are immersed in the processing solution stored in the treatment vessel 14 and a location for lift up (a location indicated by a chain double-dashed line of FIG. 1) higher than the treatment vessel 14. The upper portion 11 of the chamber 10 is opened to cause the lift driving part 34 to lift the three holding rods 32 higher than the location for lift up, allowing the substrates W to be exchanged between the lifter 30 and a transport robot located outside of the apparatus.

The gas supply mechanism 35 includes a tube 36, a gas supply source 37, and a gas valve 38. When the gas valve 38 is opened, a nitrogen gas ($N_2$) is supplied from the gas supply source 37 to the interior of the chamber 10. The exhaust mechanism 40 includes a tube 41, an exhaust pump 42, and an exhaust valve 43. The exhaust valve 43 is opened with the exhaust pump 42 being operated, so that the atmosphere in the chamber 10 is exhausted out of the apparatus. The exhaust pump 42, which is a decompression pump, provides a decompressed atmosphere less than an atmospheric pressure inside the chamber 10 when the interior of the chamber 10 is an enclosed space.

The controller 49 controls various operation mechanisms (such as the hydrofluoric acid valve 23, the rinse solution valve 25, the dopant solution valve 27, the gas valve 38, the exhaust valve 43, the exhaust pump 42, and the lift driving part 34) provided in the substrate treating apparatus 1. The hardware configuration of the controller 49 is identical to that of an ordinary computer. The controller 49 includes a CPU for performing various types of computations, a ROM which is a read-only memory storing a basic program, a RAM which is a readable/writable memory storing various types of information, and a magnetic disk storing control software and data. The CPU of the controller 49 executes a predetermined processing program, whereby the treatment in the substrate treating apparatus 1 advances.

1-2. Operation of Treating Substrate

Figure 3:
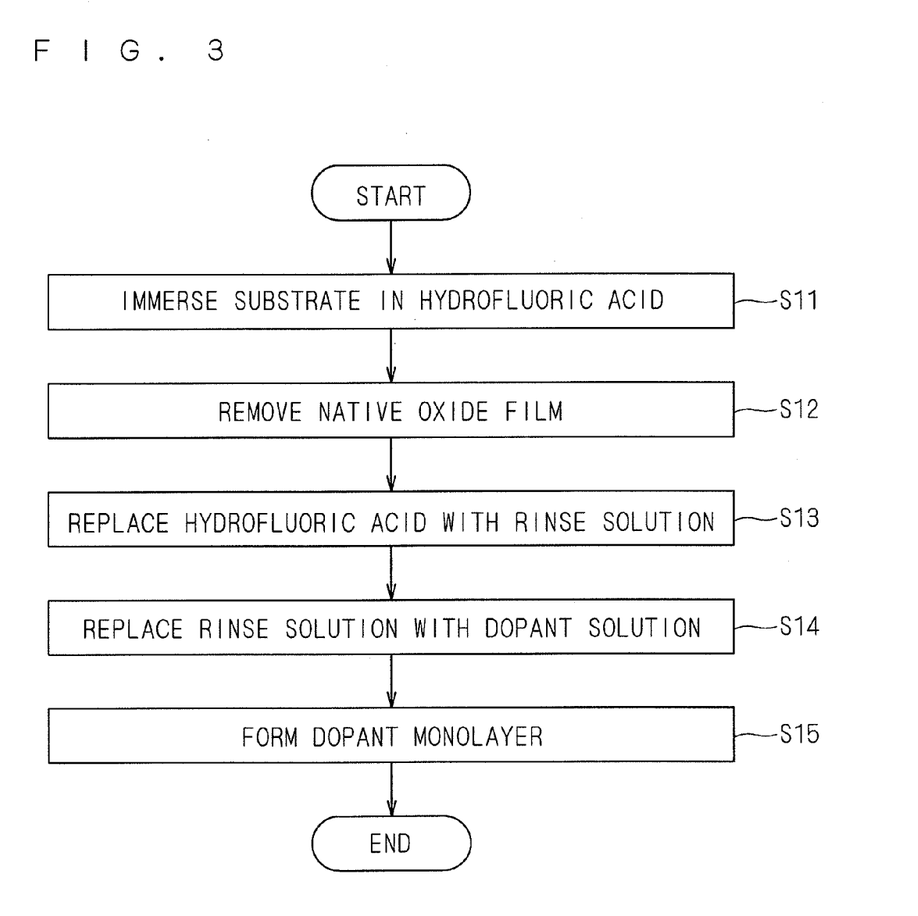
FIG. 3 is a flowchart showing a treatment procedure in the substrate treating apparatus of FIG. 1.
Figure 4A:
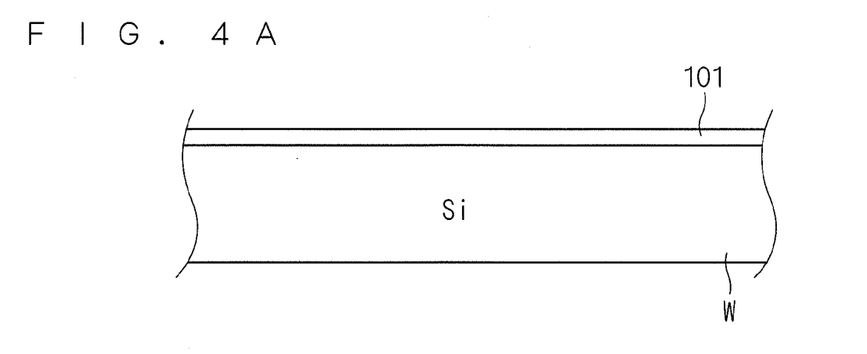
FIGS. 4A, 4B and 4C show how a state of a substrate surface changes through a substrate treatment.
Figure 4B:
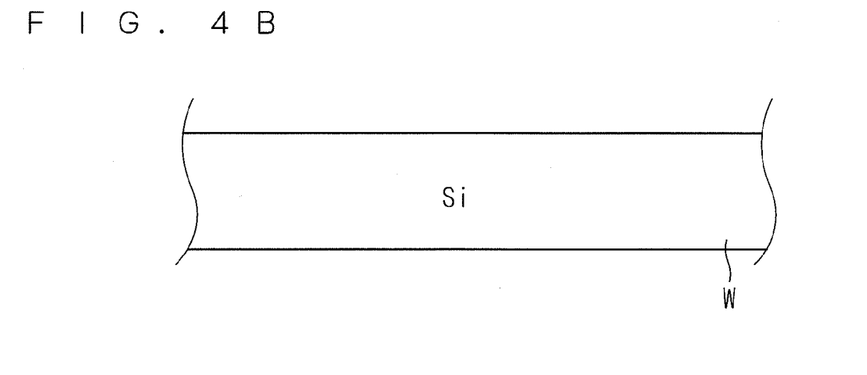
Figure 4C:
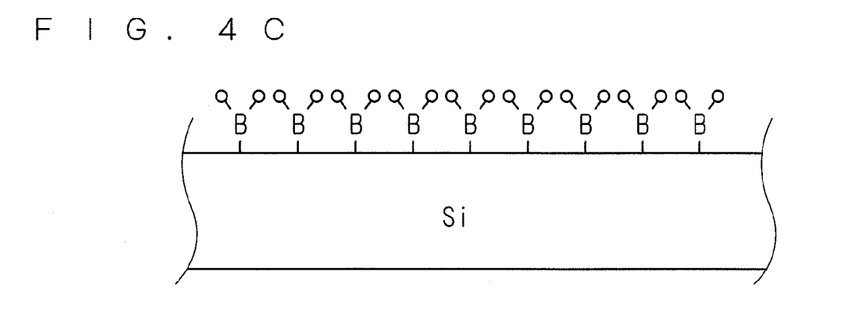

Description will be now given of the operation of treating a substrate in the substrate treating apparatus 1 according to the first embodiment, which has the above-mentioned configuration. FIG. 3 is a flowchart showing the treatment procedure in the substrate treating apparatus 1. FIGS. 4A, 4B and 4C show how the surface state of the substrate W changes through the substrate treatment. The treatment procedure described below is advanced by the controller 49 controlling each of the operation mechanisms of the substrate treating apparatus 1.

First, the lifter 30 receives a plurality of substrates W from the transport robot (not shown), starting the treatment in the substrate treating apparatus 1. As shown in FIG. 4A, a native oxide film 101 of silicon dioxide is formed on each of the surfaces of the silicon substrates W. The native oxide film 101 is a silicon dioxide film that is unavoidably formed as a result of the silicon exposed in the surface of the substrate W coming into contact with the oxygen in the air. The surface of the substrate W is a main surface in which a device pattern is formed, and a rear surface is the other main surface opposite to the above-mentioned main surface.

Then, the plurality of substrates W held by the lifter 30 are collectively lifted down, and the upper portion 11 of the chamber 10 is closed. The upper portion 11 is closed to provide an enclosed space in the chamber 10. Then, the gas valve 38 is opened, and the exhaust valve 43 is opened with the exhaust pump 42 being operated, whereby the atmosphere in the chamber 10 is replaced with a nitrogen atmosphere. Thereafter, the surface treatment for the substrate W will advance in a nitrogen atmosphere.

The plurality of substrates W are lifted down to the location for immersing in the treatment vessel 14 by the lifter 30, and is then stopped. As a result, the plurality of substrates W are held in the location for immersing in the treatment vessel 14 by the lifter 30. On this occasion, the hydrofluoric acid valve 23 is opened, and a hydrofluoric acid is stored in the treatment vessel 14. A hydrofluoric acid is continuously ejected and supplied from the ejection nozzles 16, and the hydrofluoric acid overflows from the upper end of the treatment vessel 14 to the outer vessel 15. Consequently, the plurality of substrates W fixed and held in the location for immersing are immersed in the hydrofluoric acid (Step S11). A supply of a hydrofluoric acid to the treatment vessel 14 may be started after the plurality of substrates W are lifted down to the location for immersing.

With the plurality of substrates W being immersed in the hydrofluoric acid stored in the treatment vessel 14, the ejection nozzles 16 keep supplying a hydrofluoric acid to the interior of the treatment vessel 14, so that the native oxide film 101 of silicon dioxide formed on the surface of the substrate W is etched to be removed (Step S12). As a result, as shown in FIG. 4B, silicon is exposed in the surface of the substrate W.

After the native oxide film 101 is completely removed, the hydrofluoric acid valve 23 is closed, and the rinse solution valve 25 is opened, so that a rinse solution is ejected and supplied to the interior of the treatment vessel 14 from the ejection nozzles 16. In the first embodiment, an IPA is supplied as the rinse solution. As the rinse solution is supplied from the ejection nozzles 16, the hydrofluoric acid stored in the treatment vessel 14 overflows to the outer vessel 15 and, eventually, the processing solution in the treatment vessel 14 is replaced from a hydrofluoric acid to a rinse solution (Step S13). This causes the substrates W to be immersed in the rinse solution, whereby the rinse treatment advances, in which a hydrofluoric acid is washed off from the surface of the substrate W.

After the completion of the rinse treatment performed for a predetermined period of time, the rinse solution valve 25 is closed, and the dopant solution valve 27 is opened, so that a dopant solution is ejected and supplied to the interior of the treatment vessel 14 from the ejection nozzles 16. In the first embodiment, an allylboronic acid pinacol ester is supplied as the dopant solution. As the dopant solution is supplied from the ejection nozzles 16, the rinse solution stored in the treatment vessel 14 overflows to the outer vessel 15 and, eventually, the processing solution in the treatment vessel 14 is replaced from the rinse solution to the dopant solution (Step S14). Consequently, the substrates W are immersed in the dopant solution stored in the treatment vessel 14.

The dopant solution comes into contact with the silicon exposed in the surface of the substrate W, forming a dopant-containing thin film on the surface. A large number of dangling bonds are located at the end of the silicon exposed in the surface of the substrate W by removing the native oxide film 101. The dopant solution comes into contact with the surface of the substrate in the above mentioned state, whereby the silicon dangling bonds are bonded to dopant-containing molecules. No new molecules will be further bonded to the molecules bonded to the silicon dangling bonds. Therefore, as shown in FIG. 4C, a dopant-containing monolayer thin film is formed on the surface of the substrate W (Step S15).

After the formation of the dopant-containing thin film on the surface of the substrate W, the plurality of substrates W are collectively raised from the treatment vessel 14 by the lifter 30, and are then lifted up to the location for lift up above the treatment vessel 14 to be dried. After that, the upper portion 11 is opened so that the plurality of substrates W are further lifted higher from the location for lift up by the lifter 30, to be passed to the transport robot. A series of processes of forming a thin film is performed in this manner. After that, on the substrate W having a dopant-containing monolayer thin film formed thereon, a capping layer of silicon dioxide is formed to overlie the thin film. Subsequently, the substrate W is heat-treated through a light emission from the halogen lamps or flash lamps. Through the heat treatment, the dopant of the thin film diffuses into the silicon surface layer of the substrate W, whereby impurities are introduced into an extremely shallow region.

The first embodiment continuously performs an oxide film removing step of removing the native oxide film 101 with a hydrofluoric acid, a rinse step of washing off the hydrofluoric acid with a rinse solution, and a thin film forming step of forming a dopant-containing thin film with a dopant solution. To be specific, after the removal of the native oxide film 101 using a hydrofluoric acid, the hydrofluoric acid is replaced with a rinse solution to perform the rinse step, and subsequently, the rinse solution is replaced with a dopant solution to perform the thin film forming step. In such a series of steps, the surface of the substrate W, in which the native oxide film 101 is removed to expose silicon, comes into contact with the dopant solution without coming into contact with moisture. Thus, the silicon dangling bonds exposed in the surface of the substrate W come into contact with a dopant without hydrogen-termination. The silicon dangling bonds are immediately bonded to dopant-containing molecules without an occurrence of the process of replacing the hydrogen termination with a dopant using a dopant solution. This results in a reduced time period required for replacing the stable hydrogen termination, forming a dopant-containing thin film in a short period of time. The execution of the first embodiment reduces the time period required for the thin film forming step of forming a dopant-containing thin film to about 10 seconds, which is extremely short compared with the technique disclosed in Non-Patent Document 1 (2.5 hours). Bringing a dopant solution into contact with the surface of the substrate W on which silicon dangling bonds are not hydrogen-terminated allows a dopant-containing thin film to be formed uniformly.

1-3. Modifications of First Embodiment

While the first embodiment of the present invention has been shown and described, numerous modifications and variations can be devised without departing from the scope of the invention. For example, while the oxide film removing step, the rinse step, and the thin film forming step are continuously performed in the first embodiment, the oxide film removing step and the thin film forming step of these steps may be simultaneously performed. To be specific, with a plurality of substrates W being held in the location for immersing in the treatment vessel 14, the hydrofluoric acid valve 23 and the dopant solution valve 27 are opened, so that a mixture of a hydrofluoric acid and a dopant solution is supplied to and stored in the treatment vessel 14. The substrates W are immersed in the mixture of a hydrofluoric acid and a dopant solution. When the substrates W are immersed in the mixture, the removal of the native oxide film 101 with the hydrofluoric acid and the formation of a thin film with the dopant solution advance simultaneously, forming a dopant-containing thin film on the surface of the substrate W while removing the native oxide film 101. Also in this case, a dopant-containing thin film is formed without the hydrogen termination of silicon dangling bonds on the surface of the substrate W, forming a dopant-containing thin film in a short period of time. The removal of the native oxide film 101 and the formation of a dopant-containing thin film advance simultaneously, leading to a reduced period of time required for the whole treatment as well. In this case, a rinse solution is not supplied.

The oxide film removing step and the thin film forming step may partially overlap each other. In other words, the thin film forming step is started from the middle of the oxide film removing step. To be specific, with a plurality of substrates W being held in the location for immersing in the treatment vessel 14, the hydrofluoric acid valve 23 is opened to store a hydrofluoric acid in the treatment vessel 14, advancing the treatment of removing the native oxide film 101. Then, before the completion of the oxide film removing step, the dopant solution valve 27 is opened with the hydrofluoric acid valve 23 being opened. This allows a dopant solution to be mixed with the hydrofluoric acid in the treatment vessel 14, forming a dopant-containing thin film on the surface of the substrate W. Also in this case, a dopant-containing thin film is formed without the silicon dangling bonds on the surface of the substrate W not being hydrogen-terminated, forming a dopant-containing thin film in a short period of time.

The dopant solution is not limited to an allylboronic acid pinacol ester containing boron and may be an appropriate one selectable depending on the type of a dopant to be introduced (such as phosphorous (P) or arsenic (As)).

2. Second Embodiment

2-1. Overall Apparatus Configuration

Figure 5:
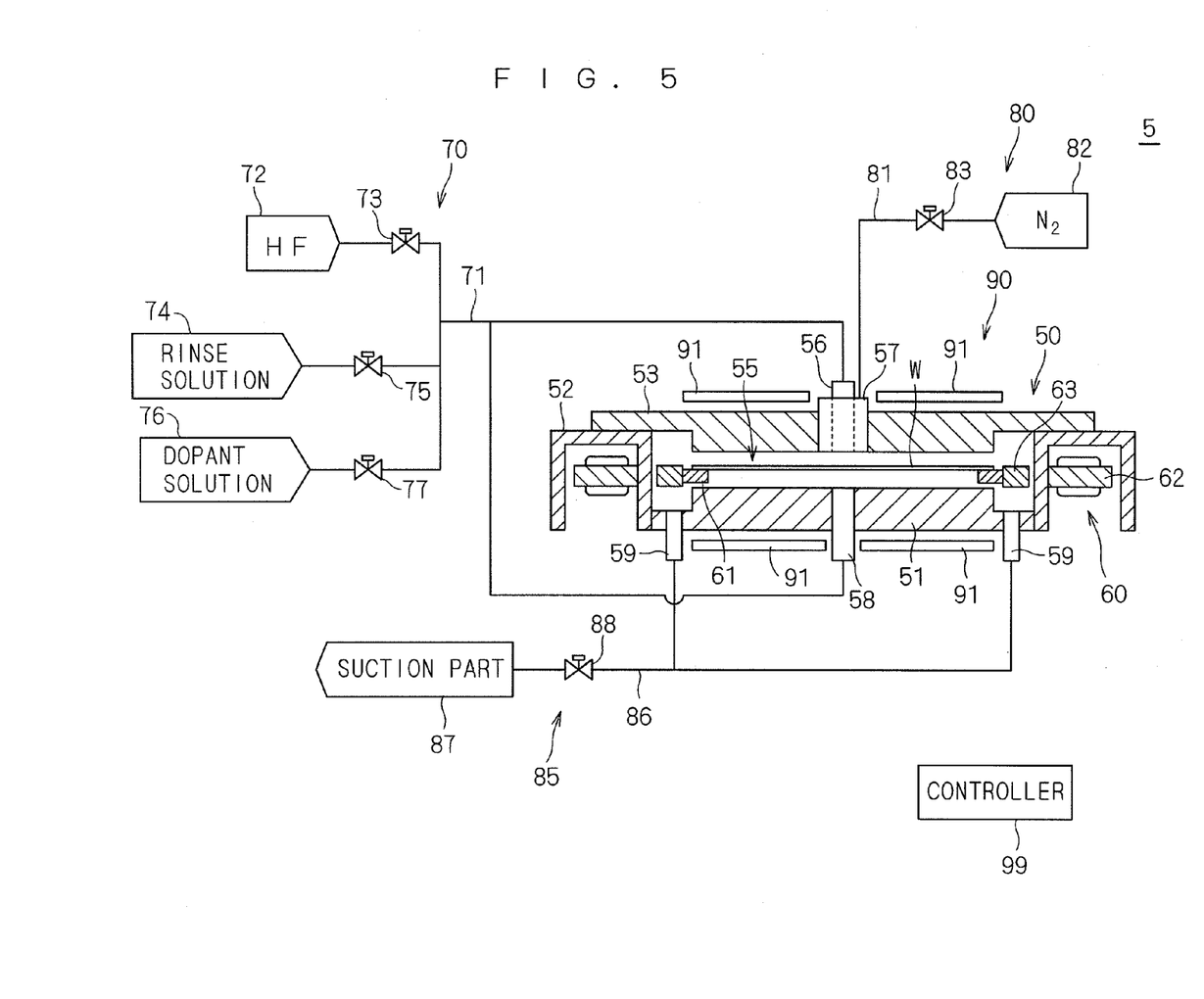
FIG. 5 is a vertical cross-sectional view of a substrate treating apparatus according to a second embodiment.

A second embodiment of the present invention will be now described. FIG. 5 is a vertical cross-sectional view of a substrate treating apparatus 5 of the second embodiment. The substrate treating apparatus 5 of the second embodiment is a single wafer type apparatus that treats the surface of one substrate W at one time.

As in the first embodiment, the substrate treating apparatus 5 performs the treatment of removing an oxide film on a plurality of substrates W using a hydrofluoric acid, and then, washes off the hydrofluoric acid from the surfaces of the substrates W using a rinse solution, thereby forming a monolayer thin film on the surface of the substrates W using a dopant-containing chemical solution. The substrate treating apparatus 5 mainly includes a chamber 50, a substrate holder 61, a substrate rotation mechanism 60, a processing solution supply mechanism 70, a gas supply mechanism 80, a suck mechanism 85, a heating part 90, and a controller 99.

The chamber 50 includes a chamber bottom 51 having substantially a circular-plate shape, a chamber side wall 52 having substantially a cylindrical shape, which is fixed to the outer circumference of the chamber bottom 51, and a chamber lid 53 having substantially a circular-plate shape, which closes an upper opening of the chamber side wall 52. The chamber lid 53 is vertically moveable by a drive mechanism (not shown). The chamber lid 53 moves upward and the upper opening of the chamber side wall 52 is opened. In this state, the substrate W is transported into and out of the chamber 50. When the chamber lid 53 closes the upper opening of the chamber side wall 52, the treatment space 55 being an enclosed space is formed inside the chamber 50. The chamber bottom 51 and the chamber lid 53, which are made of quartz, allow light to pass therethrough.

An upper processing solution tube 56 is provided in the center portion of the chamber lid 53 so as to vertically pass therethrough, and a hollow, cylindrical gas tube 57 is provided around the upper processing solution tube 56. Meanwhile, a lower processing solution tube 58 is provided in the center portion of the chamber bottom 51 so as to vertically pass therethrough. In the outer circumferential portion of the chamber bottom 51, a plurality of suck tubes 59 are circumferentially provided at equal intervals.

The substrate rotation mechanism 60, which is a so-called hollow motor, includes a stator 62 disposed circumferentially inside the chamber side wall 52, and a rotor 63 having substantially an annular shape that is disposed inside the stator 62 in the treatment space 55 of the chamber 50. The rotor 63, which is supported by the stator 62 and the chamber side wall 52 in a non-contact manner by a magnetic force acting between the stator 62 and the rotor 63, rotates about an axis extending along the vertical direction.

The substrate holder 61, which is a member having substantially an annular-plate shape fixed to the inner circumferential surface of the rotor 63 of the substrate rotation mechanism 60, is housed together with the rotor 63 in the treatment space 55 of the chamber 50. The substrate W is placed on the substrate holder 61 with its surface facing upward, thereby being held by the substrate holder 61. In other words, the substrate holder 61 supports the lower surface of the circumferential portion of the substrate W, thereby holding the substrate W. The substrate holder 61 may be formed of, for example, a plurality of projections radially projecting from the inner circumferential surface of the rotor 63 toward the inside. The substrate rotation mechanism 60 causes the rotor 63, the substrate holder 61, and the substrate W held by the substrate holder 61 to rotate about the center axis vertically passing through the center of the substrate W.

The processing solution supply mechanism 70 is the mechanism that supplies various processing solutions to the treatment space 55. The distal-end side of the supply pipe 71 of the processing solution supply mechanism 70 is branched into two portions, one of which being connected to the upper processing solution tube 56 and the other being connected to the lower processing solution tube 58. The proximal-end side of the supply pipe 71 is branched into three portions, which are respectively connected to the hydrofluoric acid supply source 72, the rinse solution supply source 74, and the dopant solution supply source 76. Of the supply pipe 71 branched into three portions at the proximal-end side, the hydrofluoric acid valve 73 is provided in the tube connected to the hydrofluoric acid supply source 72, the rinse solution valve 75 is provided in the tube connected to the rinse solution supply source 74, and the dopant solution valve 77 is provided in the tube connected to the dopant solution supply source 76.

In the above-mentioned configuration, when the hydrofluoric acid valve 73 is opened, a hydrofluoric acid is delivered from the hydrofluoric acid supply source 72 to the upper processing solution tube 56 and the lower processing solution tube 58. Then, the hydrofluoric acid is supplied from the upper processing solution tube 56 toward the center portion of the upper surface of the substrate W held by the substrate holder 61. The hydrofluoric acid is supplied from the lower processing solution tube 58 toward the center portion of the lower surface of the substrate W held by the substrate holder 61. The hydrofluoric acid supplied from the hydrofluoric acid supply source 72 shall have an appropriate concentration.

When the rinse solution valve 75 is opened, a rinse solution is delivered from the rinse solution supply source 74 to the upper processing solution tube 56 and the lower processing solution tube 58. Then, the rinse solution is supplied from the upper processing solution tube 56 toward the center portion of the upper surface of the substrate W held by the substrate holder 61, and the rinse solution is supplied from the lower processing solution tube 58 toward the center portion of the lower surface of the substrate W held by the substrate holder 61. Alcohols are used as the rinse solution, and an IPA is used also in the second embodiment. The alcohol used as the rinse solution is not limited to an IPA, which may be, for example, an ethanol.

When the dopant solution valve 77 is opened, a dopant solution is delivered from the dopant solution supply source 76 to the upper processing solution tube 56 and the lower processing solution tube 58. Then, the dopant solution is supplied from the upper processing solution tube 56 toward the center portion of the upper surface of the substrate W held by the substrate holder 61, and the dopant solution is supplied from the lower processing solution tube 58 toward the center portion of the lower surface of the substrate W held by the substrate holder 61. As in the first embodiment, the dopant solution, which is a dopant-containing chemical solution, has the property of forming a dopant-containing monolayer thin film on a surface of the silicon substrate W by coming into contact with the surface. The second embodiment also uses an allylboronic acid pinacol ester containing boron as the dopant solution.

Any one of the hydrofluoric acid valve 73, the rinse solution valve 75, and the dopant solution valve 77 may be alternatively opened, or two or more of them may be simultaneously opened. For example, when the hydrofluoric acid valve 73 and the dopant solution valve 77 are simultaneously opened, a mixture of a hydrofluoric acid and a dopant solution is supplied to the treatment space 55.

The gas supply mechanism 80 includes a tube 81, a gas supply source 82, and a gas valve 83. The distal end of the tube 81 is connected to the gas tube 57 provided to the chamber lid 53. When the gas valve 83 is opened, a nitrogen gas is supplied from the gas supply source 82 to the treatment space 55 in the chamber 50.

The suck mechanism 85 includes a tube 86, a suction part 87, and a suction valve 88. The distal end of the tube 86 is divided into a plurality of portions, which are connected to the plurality of suck tubes 59 provided in the outer circumferential portion of the chamber bottom 51. The suction valve 88 is opened with the suction part 87 being operated, whereby the atmosphere of the treatment space 55 in the chamber 50 is exhausted out of the apparatus. With the treatment space 55 being an enclosed space, the suction part 87 can provide a decompressed atmosphere less than an atmospheric pressure in the treatment space 55. The suck mechanism 85 also discharges the processing solution, which has been supplied to the chamber 50, out of the apparatus. In other words, the suck mechanism 85 discharges both of a gas and a liquid from the treatment space 55.

The heating part 90 includes lamps 91 disposed above and below the chamber 50. The lamps 91 emit light toward the substrate W via the chamber bottom 51 and the chamber lid 53 that are made of quartz, thereby heating the substrate W.

The controller 99 controls various operation mechanisms (such as the substrate rotation mechanism 60, the hydrofluoric acid valve 73, the rinse solution valve 75, the dopant solution valve 77, the gas valve 83, the suction part 87, the suction valve 88, and the lamps 91) provided in the substrate treating apparatus 5. The hardware configuration of the controller 99 is identical to that of an ordinary computer. The controller 99 includes a CPU for performing various types of computations, a ROM which is a read-only memory storing a basic program, a RAM which is a readable/writable memory storing various types of information, and a magnetic disk storing control software and data. The CPU of the controller 99 executes a predetermined processing program, whereby the treatment in the substrate treating apparatus 5 advances.

2-2. Operation of Treating Substrate

Figure 6:
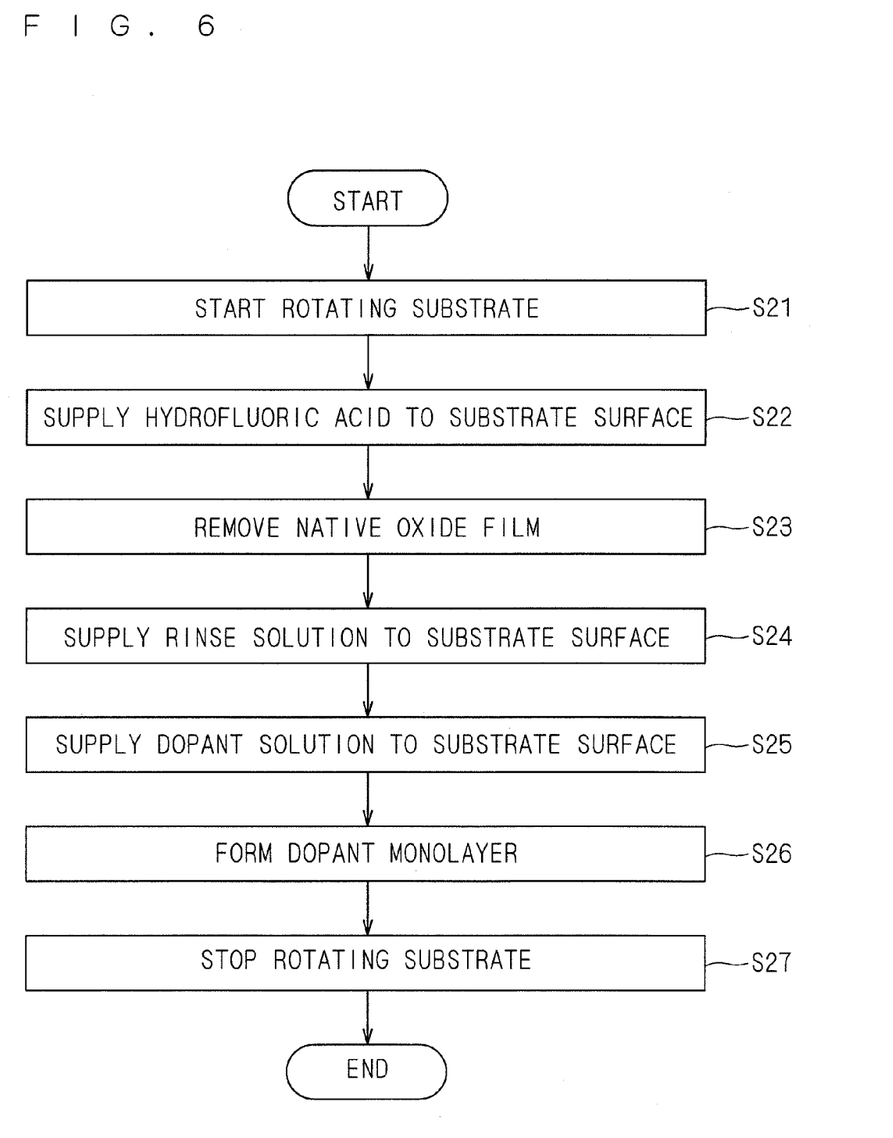
FIG. 6 is a flowchart showing a treatment procedure in the substrate treating apparatus of FIG. 5.

Description will be now given of the operation of treating a substrate in the substrate treating apparatus 5 of the second embodiment, which has the above-mentioned configuration. FIG. 6 is a flowchart showing the treatment procedure in the substrate treating apparatus 5. The treatment procedure described below is advanced by the controller 99 controlling each of the operation mechanisms of the substrate treating apparatus 5.

First, the chamber lid 53 moves upward to open the upper opening of the chamber side wall 52, so that the substrate W is transported into the chamber 50 by a transport robot (not shown). The native oxide film 101 of silicon dioxide is formed on the surface of the silicon substrate W (see FIG. 4A). The surface of the substrate W is a main surface in which a device pattern is formed, and a rear surface is a main surface opposite to the above-mentioned main surface. The transported substrate W is held by the substrate holder 61, with its upper surface facing upward. The chamber lid 53 closes the upper opening of the chamber side wall 52, so that the treatment space 55 turns into an enclosed space. After the chamber 50 is hermetically sealed, the gas valve 83 is opened, whereby a nitrogen gas is supplied to the treatment space 55 from the gas tube 57. The suction valve 88 is opened with the suction part 87 being operated to evacuate the treatment space 55, so that the treatment space 55 in the chamber 50 is replaced with a nitrogen atmosphere. The surface treatment for the substrate W will advance in the nitrogen atmosphere.

The atmosphere in the treatment space 55 is replaced with a nitrogen atmosphere, and the substrate rotation mechanism 60 starts rotating the substrate W (Step S21). The substrate W is rotated in substantially a horizontal plane, with its rotation center as the center axis that passes through the center thereof vertically.

Then, the hydrofluoric acid valve 73 is opened, so that a hydrofluoric acid is supplied to the portion near the center of the upper surface of the substrate W from the upper processing solution tube 56 and is supplied to the portion near the center of the lower surface of the substrate W from the lower processing solution tube 58 (Step S22). The hydrofluoric acids supplied to the portions near the centers of the upper and lower surfaces of the substrate W spread to the peripheral portion of the substrate W by the centrifugal force associated with the rotation of the substrate W. As a result, the entire surface of the substrate W is covered with the hydrofluoric acid. Then, the native oxide film 101 of silicon dioxide formed on the surface of the substrate W is etched to be removed (Step S23). As a result, silicon is exposed in the surface of the substrate W (see FIG. 4B). The processing solution that has sprayed from the peripheral portion of the substrate W is sucked by the suck mechanism 85 to be discharged out of the apparatus.

After the removal of the native oxide film 101, the hydrofluoric acid valve 73 is closed, thereby stopping a supply of a hydrofluoric acid. The rinse solution valve 75 is subsequently opened, so that a rinse solution is supplied to the portion near the center of the upper surface of the substrate W from the upper processing solution tube 56 and is supplied to the portion near the center of the lower surface of the substrate W from the lower processing solution tube 58 (Step S24). Also in the second embodiment, an IPA is supplied as the rinse solution. The rinse solutions supplied to the portions near the centers of the upper and lower surfaces of the substrate W spread to the peripheral portion of the substrate W by the centrifugal force associated with the rotation of the substrate W. Consequently, the rinse treatment of washing off a hydrofluoric acid from the surface of the substrate W advances.

In the second embodiment, the surface of the substrate W is not covered with a liquid and is exposed to the atmosphere of the treatment space 55 during the time period from the stop of a hydrofluoric acid to end the oxide film removing step to the start of the rinse step. However, the treatment space 55 has a nitrogen atmosphere and is free from oxygen and hydrogen, preventing the surface of the substrate W, in which silicon is exposed, from being oxidized again or being hydrogen-terminated.

After the completion of the rinse treatment performed for a predetermine time period, the rinse solution valve 75 is closed, stopping a supply of a rinse solution. The dopant solution valve 77 is subsequently opened, so that a dopant solution is supplied to the portion near the center of the upper surface of the substrate W from the upper processing solution tube 56 and is supplied to the portion near the center of the lower surface of the substrate W from the lower processing solution tube 58 (Step S25). Also in the second embodiment, an allylboronic acid pinacol ester is supplied as the dopant solution. The dopant solutions supplied to the portions near the centers of the upper and lower surfaces of the substrate W spread to the peripheral portion of the substrate W by the centrifugal force associated with the rotation of the substrate W. As a result, the entire surface of the substrate W is covered with the dopant solution. The treatment space 55 has a nitrogen atmosphere during a time period from the stop of a supply of a rinse solution to the start of a supply of a dopant solution, preventing the surface of the substrate W from being oxidized or being hydrogen-terminated.

The dopant solution comes into contact with the silicon exposed in the surface of the substrate W, so that a dopant-containing thin film is formed on the surface. As in the first embodiment, there are a large number of dangling bonds at the end of the silicon exposed in the surface of the substrate W through the removal of the native oxide film 101. The dopant solution comes into contact with the above-mentioned surface of the substrate W, forming a dopant-containing monolayer thin film on the surface (Step S26).

After the formation of a dopant thin film on the surface of the substrate W, the substrate rotation mechanism 60 stops rotating the substrate W (Step S27). After that, the chamber lid 53 moves upward to open the upper opening of the chamber side wall 52, whereby the transport robot (not shown) delivers the treated substrate W out of the chamber 50. In this manner, a series of processes of forming a thin film is performed.

The second embodiment performs the oxide film removing step of removing the native oxide film 101 with a hydrofluoric acid, the rinse step of washing off the hydrofluoric acid with a rinse solution, and the thin film forming step of forming a dopant-containing thin film with the dopant solution in a nitrogen atmosphere, that is, in a non-air atmosphere free from oxygen and hydrogen. For this reason, the dangling bonds of the silicon exposed in the surface of the substrate W is not oxidized or hydrogen-terminated, and the dopant comes into contact with the surface. Therefore, the silicon dangling bonds are immediately bonded to dopant-containing molecules without an occurrence of the process of replacing the hydrogen termination with a dopant using a dopant solution. This results in a reduced time period required for replacing the hydrogen termination, forming a dopant-containing thin film in a short period of time, as in the first embodiment. The second embodiment also reduces a time period required for the thin film forming step of forming a dopant-containing thin film to about 10 seconds. Bringing a dopant solution into contact with the surface of the substrate W, in which silicon dangling bonds are not hydrogen-terminated, allows a dopant-containing thin film to be formed uniformly.

2-3. Modifications of Second Embodiment

While the second embodiment of the present invention has been shown and described, numerous modifications and variations can be devised without departing from the scope of the invention. For example, while the second embodiment performs the oxide film removing step, the rinse step, and the thin film forming step in a nitrogen atmosphere, those steps may be performed under a decompressed atmosphere. To be specific, the substrate W is transported into the chamber 50 and the chamber 50 is hermetically sealed, and subsequently, the suction valve 88 is opened with the gas valve 83 being closed, providing a decompressed atmosphere less than an atmospheric pressure in the treatment space 55 of the chamber 50 through exhausting by the suction part 87. Then, the treatments of Steps S21 to S27 similar to those of the second embodiment are performed under a decompressed atmosphere. Also in this case, a series of the oxide film removing step, the rinse step, and the thin film forming step is performed in an atmosphere free from hydrogen. This enables the formation of a dopant-containing thin film without the silicon dangling bonds in the surface of the substrate W being hydrogen-terminated, forming a dopant-containing thin film in a short period of time. In other words, a series of the oxide film removing step, the rinse step, and the thin film forming step may be performed in a non-air atmosphere such as a nitrogen atmosphere or a decompressed atmosphere.

The oxide film removing step, the rinse step, and the thin film forming step may slightly overlap one another to be continuously performed. To be specific, the rinse solution valve 75 is opened before the hydrofluoric acid valve 73 is closed so that the hydrofluoric acid covering the surface of the substrate W is replaced with a rinse solution. Similarly, the dopant solution valve 77 is opened before the rinse solution valve 75 is closed so that the rinse solution covering the surface of the substrate W is replaced with a dopant solution. This allows the surface of the substrate W to be always covered with a liquid during a series of treatment steps, preventing the surface of the substrate W from being exposed to the atmosphere of the treatment space 55. Thus, even if the treatment space 55 does not have a non-air atmosphere, as in the first embodiment, a dopant comes into contact with the surface without the silicon dangling bonds exposed in the surface of the substrate W being hydrogen-terminated, forming a dopant-containing thin film in a short period of time.

Figure 7A:
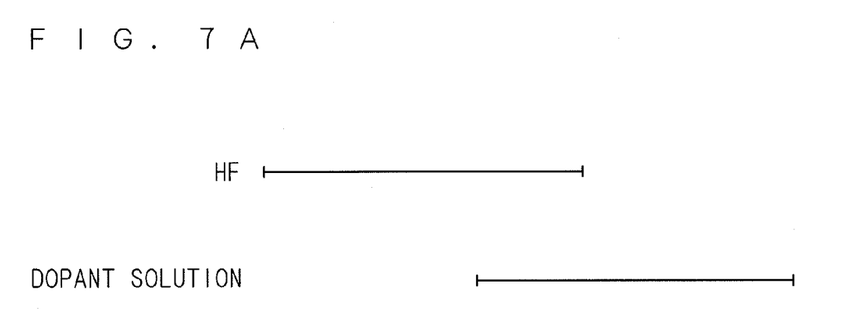
FIGS. 7A and 7B show timing charts of examples in which an oxide film removing step and a thin film forming step overlap each other.
Figure 7B:
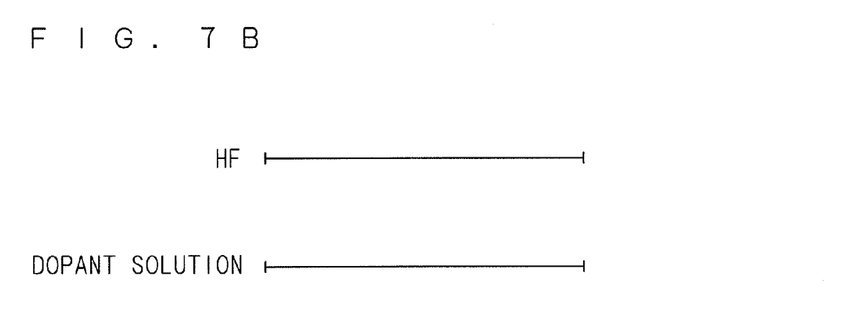

The oxide film removing step and the thin film forming step may overlap each other without the execution of the rinse step. FIGS. 7A and 7B shows the timing charts of examples in which the oxide film removing step and the thin film forming step overlap each other. In the example of FIG. 7A, the oxide film removing step and the thin film forming step partially overlap each other. In other words, the thin film forming step is started from the middle of the oxide film removing step. To be specific, the hydrofluoric acid valve 73 is opened to start a supply of a hydrofluoric acid to the surface of the rotating substrate W. Then, the dopant solution valve 77 is opened before the hydrofluoric acid valve 73 is closed to start a supply of a dopant solution from the middle of the supply of the hydrofluoric acid, supplying the dopant solution while temporarily supplying the hydrofluoric acid. This results in that the dopant solution is mixed with the hydrofluoric acid covering the surface of the substrate, immediately bringing the dopant solution into contact with the surface of the substrate W from which the native oxide film 101 has been removed. Also in this case, a dopant-containing thin film is formed without the silicon dangling bonds on the surface of the substrate W being hydrogen-terminated, forming a dopant-containing thin film in a short period of time.

In the example of FIG. 7B, meanwhile, the oxide film removing step and the thin film forming step completely overlap each other. In other words, the oxide film removing step and the thin film forming step are simultaneously performed in parallel. To be specific, the hydrofluoric acid valve 73 and the dopant solution valve 77 are simultaneously opened, starting a supply of a mixture of a hydrofluoric acid and a dopant solution to the surface of the rotating substrate W. This allows the entire surface of the substrate W to be covered with the mixture of a hydrofluoric acid and a dopant solution. As a result, the removal of the native oxide film 101 with a hydrofluoric acid and the formation of a thin film with a dopant solution advance in parallel, forming a dopant-containing thin film on the surface of the substrate W while removing the native oxide film 101. Also in this case, a dopant-containing thin film is formed without the silicon dangling bonds on the surface of the substrate W being hydrogen-terminated, forming a dopant-containing thin film in a short period of time. This omits the rinse step and simultaneously advances the removable of the native oxide film 101 and the formation of a dopant-containing thin film, reducing a time period required for the entire treatment.

As in the first embodiment, the dopant solution is not limited to an allylboronic acid pinacol ester containing boron and may be an appropriate one selectable depending on the type of a dopant to be introduced (such as phosphorous (P) or arsenic (As)).

DESCRIPTION OF REFERENCE SIGNS 1, 5 substrate treating apparatus
10, 50 chamber 14 treatment vessel
16 ejection nozzle
20, 70 processing solution supply mechanism
22, 72 hydrofluoric acid supply source
23, 73 hydrofluoric acid valve
24, 74 rinse solution supply source
25, 75 rinse solution valve
26, 76 dopant solution supply source
27, 77 dopant solution valve
30 lifter
35, 80 gas supply mechanism
40 exhaust mechanism
49, 99 controller
55 treatment space
56 upper processing solution tube
58 lower processing solution tube
60 substrate rotation mechanism
61 substrate holder
85 suck mechanism

The invention claimed is:

1. A substrate treatment method for forming a dopant-containing thin film on a surface of a substrate, the method comprising:
    providing a substrate that is without an oxide film; and
    supplying a dopant solution to the surface of said substrate that is without an oxide film to form a dopant-containing thin film thereon; and
    performing said supplying step without performing hydrogen-termination to the surface of said substrate.

2. The substrate treatment method according to claim 1, comprising:
    an oxide film removing step of supplying a hydrofluoric acid to a surface of said substrate to remove an oxide film formed on the surface thereof, to form said substrate that is without an oxide film;
    a rinse step of supplying a rinse solution to said surface to wash off the hydrofluoric acid after said oxide film removing step; and
    a thin film forming step of supplying said dopant solution to said surface to form said thin film after said rinse step.

3. The substrate treatment method according to claim 2, wherein said oxide film removing step, said rinse step, and said thin film forming step are performed sequentially.

4. The substrate treatment method according to claim 2, wherein said oxide film removing step, said rinse step, and said thin film forming step are performed in a non-atmospheric environment.

5. The substrate treatment method according to claim 1, wherein the supplying step comprises supplying a mixture of a hydrofluoric acid and a dopant solution to the surface of said substrate to form a dopant-containing thin film on said surface.

6. The substrate treatment method according to claim 1, comprising:
    an oxide film removing step of supplying a hydrofluoric acid to a surface of said substrate to remove an oxide film formed on the surface thereof, to form said substrate that is without an oxide film; and
    a thin film forming step of supplying the dopant solution to said surface to form said thin film,
    wherein said thin film forming step is started during said oxide film removing step.

7. The substrate treatment method according to claim 1, including
    forming the thin film on the surface of the substrate with a dopant solution as a monolayer.

* * * * *